United States Patent
Yang

(10) Patent No.: US 9,525,340 B1
(45) Date of Patent: Dec. 20, 2016

(54) BOOST CAPACITOR CIRCUIT AND CHARGE PUMP

(71) Applicant: SHANGHAI HUAHONG GRACE SEMICONDUCTOR MANUFACTURING CORPORATION, Shanghai (CN)

(72) Inventor: Guangjun Yang, Shanghai (CN)

(73) Assignee: SHANGHAI HUAHONG GRACE SEMICONDUCTOR MANUFACTURING CORPORATION, Shanghai (CN)

( * ) Notice: Subject to any disclaimer, the term of this patent is extended or adjusted under 35 U.S.C. 154(b) by 0 days.

(21) Appl. No.: 14/976,789

(22) Filed: Dec. 21, 2015

(30) Foreign Application Priority Data

Jun. 7, 2015  (CN) .......................... 2015 1 0310618

(51) Int. Cl.
G05F 1/10 (2006.01)
H02M 3/07 (2006.01)
H03K 17/687 (2006.01)

(52) U.S. Cl.
CPC ........... *H02M 3/07* (2013.01); *H03K 17/6872* (2013.01)

(58) Field of Classification Search
None
See application file for complete search history.

(56) References Cited

U.S. PATENT DOCUMENTS

| 5,831,470 | A * | 11/1998 | Park | H02M 3/073 327/536 |
| 6,430,093 | B1 * | 8/2002 | Eliason | G11C 8/08 326/88 |
| 6,721,210 | B1 * | 4/2004 | Oh | G11C 5/145 365/189.09 |
| 6,798,275 | B1 * | 9/2004 | Le | G11C 8/08 327/536 |
| 2006/0186948 | A1 * | 8/2006 | Kelly | H02M 3/073 327/536 |
| 2008/0136805 | A1 * | 6/2008 | Kawagoshi | G09G 3/3696 345/211 |
| 2009/0039947 | A1 * | 2/2009 | Williams | H02M 3/07 327/536 |
| 2009/0134937 | A1 * | 5/2009 | Kim | G11C 5/145 327/536 |
| 2010/0207684 | A1 * | 8/2010 | Park | H02M 3/07 327/536 |
| 2010/0277837 | A1 * | 11/2010 | Myhre | H02M 1/4225 361/18 |

(Continued)

*Primary Examiner* — Cassandra Cox
(74) *Attorney, Agent, or Firm* — Muncy, Geissler, Olds & Lowe, P.C.

(57) ABSTRACT

A boost capacitor circuit is disclosed which includes a first nMOS transistor and a voltage doubler circuit including: a first pMOS transistor having a drain coupled to a working voltage, a source coupled to a first node and a gate coupled to a second node; a drive inverter having an input terminal for receiving a first signal; a second pMOS transistor having a gate coupled to an output terminal of the drive inverter, a source and a drain coupled to each other and further to the first node; a third pMOS transistor having a gate for receiving the first signal, a source coupled to the first node and a drain coupled to the second node; and a second nMOS transistor having a gate for receiving the first signal, a source coupled to a low voltage and a drain coupled to the second node.

14 Claims, 3 Drawing Sheets

(56) References Cited

U.S. PATENT DOCUMENTS

2011/0050349 A1\* 3/2011 Strickland ............. H03F 1/0211
 330/297
2014/0185373 A1\* 7/2014 Tsukada ................. G11C 5/145
 365/163

\* cited by examiner

BOOST CAPACITOR CIRCUIT AND CHARGE PUMP

CROSS-REFERENCES TO RELATED APPLICATIONS

This application claims the priority of Chinese patent application number 201510310618.2, filed on Jun. 7, 2015, the entire contents of which are incorporated herein by reference.

TECHNICAL FIELD

The present invention relates to the field of circuit designing technology and, more particularly, to boost capacitor circuits and charge pumps.

BACKGROUND

In integrated circuit systems, there are typically a number of circuits requiring DC voltages exceeding the supply voltage for fulfilling particular tasks. For example, in a flash memory device, a high voltage must be generated for data programming and erasing. A flash memory device incorporates several arrays of memory cells each typically resembling a field-effect transistor (FET) including a floating gate residing on the surface of a tunneling oxide layer for accumulating a charge corresponding to one bit of data information. In the flash memory device, data programming and erasing is accomplished by performing such control that a charge is injected in or released from the floating gate. The data programming in the flash memory device requires injection of a charge from a channel into the floating gate via the tunneling oxide layer by means of hot-electron injection. In doing this, the hot-electron injection requires high energy to make the charge pass through the gate oxide. The erase of data from the flash memory device requires the charge in the floating gate to be drawn back to the channel by tunneling through the tunneling oxide layer. During this process, the tunneling requires even higher energy to enable the charge to travel back to the channel. For a memory device, data programming typically requires a voltage that is far higher than its supply voltage. Conventional flash memory devices are powered by a voltage of 1.5 V and require a voltage in the range of from 7 V to 8 V for enabling their data programming. For this reason, conventional flash memory devices incorporate a charge pump in their circuitry to raise the 1.5 V power supply voltage to 7-8 V that is required by the data programming operation.

Conventionally, the charge pump is constructed by series-connected stages of boost capacitor circuits each having a boost capacitor for accumulating a charge and thereby driving an input voltage to a higher output voltage. However, in the conventional charge pump, the boost capacitor circuits operate with voltage amplitude equal to the working voltage VDD and can accumulate a boost charge C×VDD on each unit area of the capacitors, where C represents capacitance per unit area. C×VDD measures area efficiency (i.e., the amount of charge that can be provided by each unit area of the capacitors) of the charge pump. Therefore, the conventional charge pump can accumulate a low amount of charge on each unit area, i.e., low area efficiency.

SUMMARY OF THE INVENTION

It is therefore an objective of the present invention to provide boost capacitor circuits and charge pumps with improved area efficiency.

In pursuit of this objective, the present invention provides a boost capacitor circuit, including a first nMOS transistor and a voltage doubler circuit, the first nMOS transistor having a gate for providing a boosted voltage, the voltage doubler circuit including:

a first pMOS transistor, having a drain coupled to a working voltage, a source coupled to a first node and a gate coupled to a second node;

a drive inverter, having an input terminal for receiving a first signal;

a second pMOS transistor, having a gate coupled to an output terminal of the drive inverter, a source and a drain coupled to each other and further to the first node;

a third pMOS transistor having a gate for receiving the first signal, a source coupled to the first node and a drain coupled to the second node; and a second nMOS transistor, having a gate for receiving the first signal, a source coupled to a low voltage and a drain coupled to the second node, wherein a source and a drain of the first nMOS transistor are coupled to each other and further to the second node for receiving a second signal from the second node.

Further, in the boost capacitor circuit, the first signal may be valid when a voltage thereof is equal to the working voltage.

Further, in the boost capacitor circuit, the second signal may be invalid when the first signal is valid, and the second signal may be valid and has a voltage that is twice the working voltage when the first signal is invalid.

Further, in the boost capacitor circuit, the first nMOS transistor may be a thick-gate-oxide nMOS transistor.

Further, in the boost capacitor circuit, the first nMOS transistor may have a gate oxide layer with a thickness of 60-200 Å.

Further, in the boost capacitor circuit, the first pMOS transistor and the second pMOS transistor may both be thin-gate oxide pMOS transistors.

Further, in the boost capacitor circuit, both of the first pMOS transistor and the second pMOS transistor may have a gate oxide layer with a thickness of smaller than 40 Å.

Further, in the boost capacitor circuit, the third pMOS transistor may be a thick-gate-oxide pMOS transistor, and the second nMOS transistor may be a thick-gate-oxide nMOS transistor.

Further, in the boost capacitor circuit, the third pMOS transistor and the second nMOS transistor may both have a gate oxide layer with a thickness of 60-200 Å.

According to another aspect of the present invention, there is also provided a charge pump including n stages of boost capacitor circuits as defined above, in which the gates of the first nMOS transistors of the n stages of boost capacitor circuits are connected one after another, and n is a positive integer greater than or equal to 2.

Boost capacitor circuits and charge pumps consistent with the present invention are advantageous over the conventional designs in that, the voltage at the second node is raised by the voltage doubler circuit so that the first nMOS transistor can provide a boosted voltage at its gate with expanded amplitude, which leads to an improvement in area efficiency.

DETAILED DESCRIPTION

Figure 1:
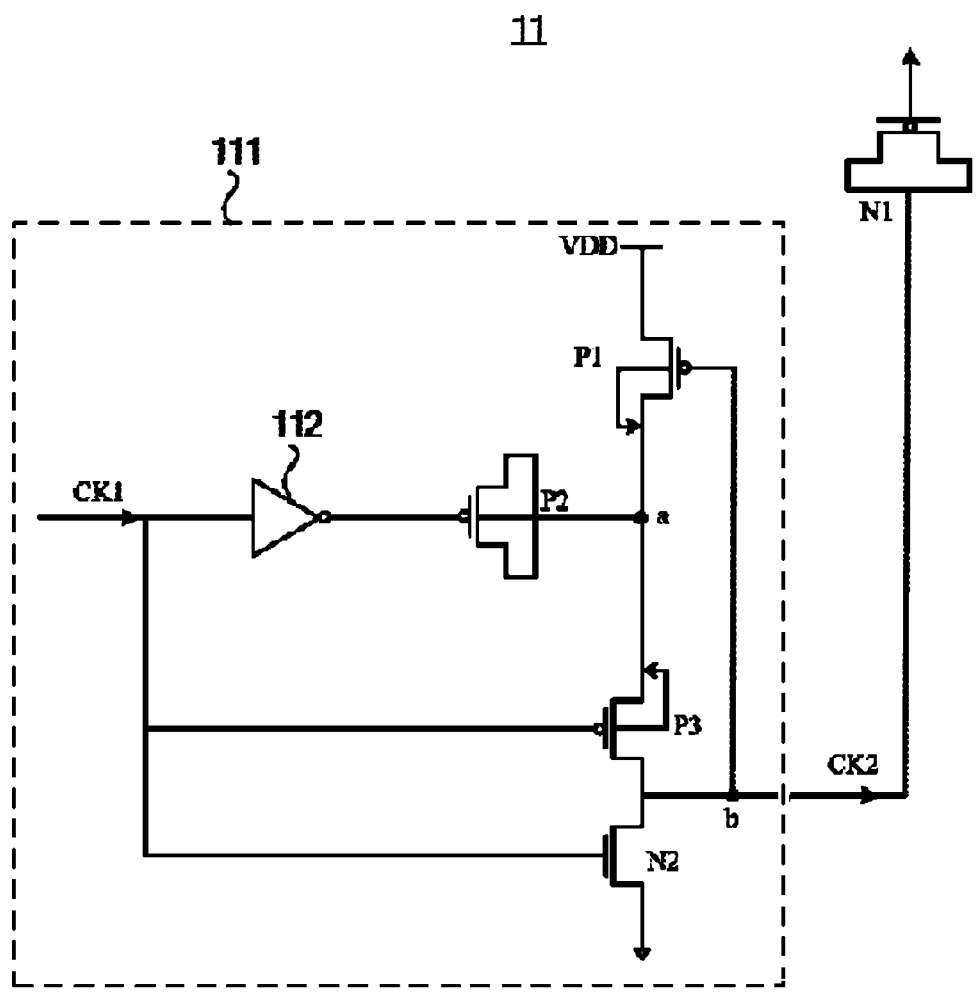
FIG. 1 is a schematic illustration of a boost capacitor circuit according to an embodiment of the present invention.

Boost capacitor circuits and charge pumps according to the present invention will be described in greater detail in the following description which presents preferred embodiments of the invention, in conjunction with the accompanying drawing. It is to be appreciated that those of skill in the art can make changes in the invention disclosed herein while still obtaining the beneficial results thereof. Therefore, the following description shall be construed as being intended to be widely known by those skilled in the art rather than as limiting the invention.

For simplicity and clarity of illustration, not all features of the specific embodiments are described. Additionally, descriptions and details of well-known functions and structures are omitted to avoid unnecessarily obscuring the invention. The development of any specific embodiment of the present invention includes specific decisions made to achieve the developer's specific goals, such as compliance with system related and business related constraints, which will vary from one implementation to another. Moreover, such a development effort might be complex and time-consuming but would nevertheless be a routine undertaking for those of ordinary skill in the art.

The present invention will be further described in the following paragraphs by way of example with reference to the accompanying drawing. Features and advantages of the invention will be more apparent from the following detailed description, and from the appended claims. Note that the accompanying drawing is provided in a very simplified form not necessarily presented to scale, with the only intention of facilitating convenience and clarity in explaining a few exemplary embodiments of the invention.

The core concept of the present invention is to provide a boost capacitor circuit including a first nMOS transistor and a voltage doubler circuit, the first nMOS transistor having a gate for providing a boosted voltage, the voltage doubler circuit including: a first pMOS transistor, having a drain coupled to a working voltage, a source coupled to a first node and a gate coupled to a second node; a drive inverter, having an input terminal for receiving a first signal; a second pMOS transistor, having a gate coupled to an output terminal of the drive inverter, a source and a drain coupled to each other and further to the first node; a third pMOS transistor having a gate for receiving the first signal, a source coupled to the first node and a drain coupled to the second node; and a second nMOS transistor, having a gate for receiving the first signal, a source coupled to a low voltage and a drain coupled to the second node, wherein a source and a drain of the first nMOS transistor are coupled to each other and provided with a second signal by the second node. In the boost capacitor circuit, the voltage at the second node is increased by the voltage doubler circuit so that the first nMOS transistor can provide a boosted voltage at its gate with expanded amplitude, which leads to improved area efficiency.

Figure 2:
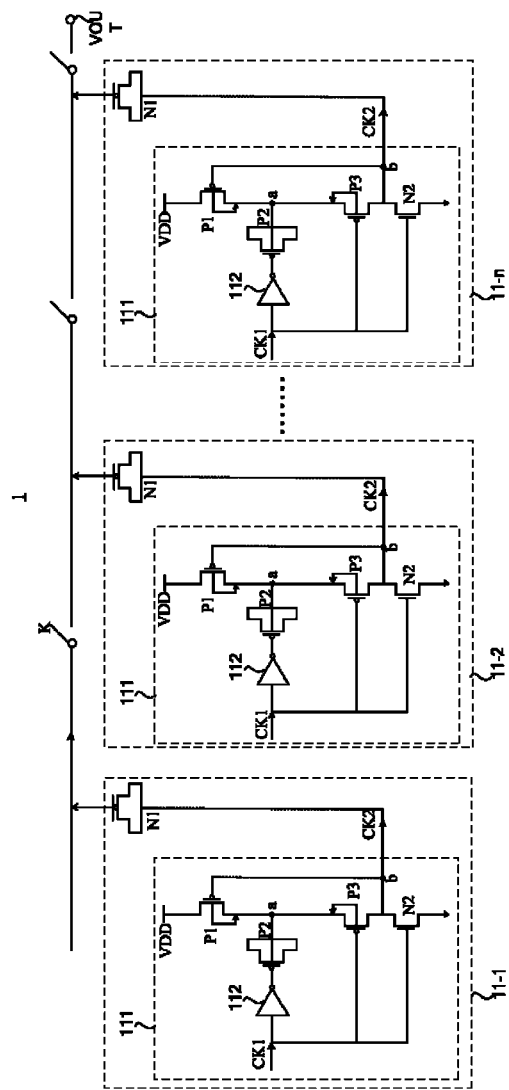
FIG. 2 is a schematic illustration of a charge pump according to an embodiment of the present invention.
Figure 3:
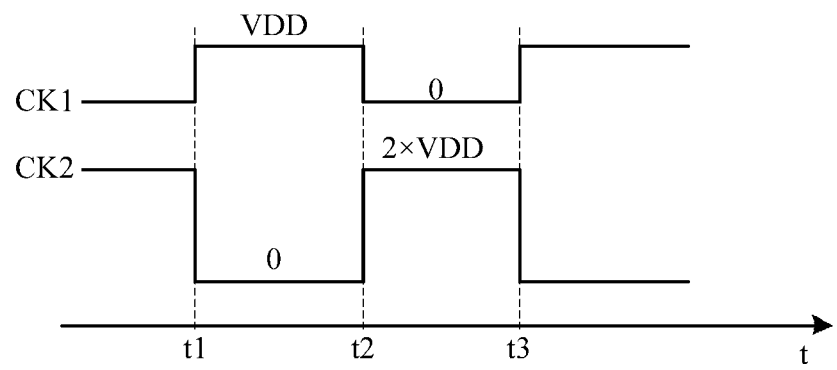
FIG. 3 schematically illustrates voltage changes of a first signal and a second signal according to an embodiment of the present invention.

Reference is made to FIGS. 1 to 3 below to describe in detail boost capacitor circuits and charge pumps according to embodiments of the present invention. In these figures, FIG. 1 is a schematic illustration of a boost capacitor circuit according to an embodiment of the present invention; FIG. 2 is a schematic illustration of a charge pump according to an embodiment of the present invention; and FIG. 3 schematically illustrates voltage changes of a first signal and a second signal according to an embodiment of the present invention.

As shown in FIG. 1, the boost capacitor circuit 11 includes a first nMOS transistor N1 and a voltage doubler circuit 111. The first nMOS transistor N1 has a gate for providing a boosted voltage. In this embodiment, the first nMOS transistor N1 is a thick-gate-oxide nMOS transistor that is a low-threshold nMOS transistor. In general terms, a thick gate oxide layer refers to a gate oxide layer having a thickness of greater than 60 Å. Preferably, the first nMOS transistor N1 has a gate oxide layer with a thickness of 60-200 Å such as, for example, 120 Å, 180 Å and so forth.

The voltage doubler circuit 111 includes a first pMOS transistor P1, a drive inverter 112, a second pMOS transistor P2, a third pMOS transistor P3 and a second nMOS transistor N2. The first pMOS transistor P1 has a drain coupled to a working voltage VDD, a source coupled to a first node a and a gate coupled to a second node b. In this embodiment, the first pMOS transistor P1 is a thin-gate-oxide pMOS transistor. Preferably, the first pMOS transistor P1 has a gate oxide layer with a thickness of smaller than 40 Å, such as, for example, 18 Å, 25 Å, 30 Å and so forth.

The drive inverter 112 has an input terminal for receiving a first signal CK1, and an output terminal coupled to a gate of the second pMOS transistor P2. The second pMOS transistor P2 has a source and a drain that are coupled to each other and further to the first node a. In addition, a substrate of the second pMOS transistor P2 is also coupled to the source and the drain thereof. In this embodiment, the second pMOS transistor P2 is a thin-gate-oxide pMOS transistor. In general terms, a thin gate oxide layer refers to a gate oxide layer with a thickness of smaller than 40 Å. Preferably, the second pMOS transistor P2 has a gate oxide layer with a thickness of smaller than 40 Å, such as, for example, 18 Å, 25 Å, 30 Å and so forth.

The third pMOS transistor P3 has a gate for receiving the first signal CK1, a source coupled to the first node a and a drain coupled to the second node b. In this embodiment, the third pMOS transistor P3 is a thick-gate-oxide pMOS transistor. Preferably, the third pMOS transistor P3 has a gate oxide layer with a thickness of 60-200 Å such as, for example, 120 Å, 180 Å and so forth.

The second nMOS transistor N2 has a gate for receiving the first signal CK1, a source coupled to a low voltage (for example, the ground) and a drain coupled to the second node b. In this embodiment, the second nMOS transistor N2 is a thick-gate-oxide nMOS transistor. Preferably, the second nMOS transistor N2 has a gate oxide layer with a thickness of 60-200 Å such as, for example, 120 Å, 180 Å and so forth.

As shown in FIG. 1, a source and a drain of the first nMOS transistor N1 are coupled to each other, with a substrate thereof being grounded. The second node b provides the source and the drain of the first nMOS transistor N1 with a second signal CK2.

The boost capacitor circuit 11 is for accumulating a charge and thereby driving an input voltage to a higher output voltage. As shown in FIG. 2, the charge pump 1 includes n stages of the boost capacitor circuits, i.e., a first-stage boost capacitor circuit 11-1, a second-stage boost capacitor circuit 11-2, . . . , and an n-th-stage boost capacitor circuit 11-$n$. Of the n stages of the boost capacitor circuits, the gates of the first nMOS transistors N1 are connected one after another and further coupled to an output terminal VOUT of the charge pump 1. The output terminal VOUT is configured to provide an output voltage to a memory cell. In addition, in this embodiment, a switching element K is disposed between each adjacent two of the n stages of boost capacitor circuits and between the last one of the n stages of boost capacitor circuits and the output terminal VOUT.

In this embodiment, when the first signal CK1 is valid, it has a voltage that is equal to the working voltage VDD. Referring to FIG. 3, in which the abscissa axis represents time t, at an instant t1, the first signal CK1 becomes valid (of high level), and its voltage is equal to the working voltage VDD. As a result, the first nMOS transistor N1 brings the voltage at the second node b down to 0 V. The second signal CK2 is invalid (of low level) and has a voltage of 0V. The first nMOS transistor N1 outputs a boosted voltage of 0 V at its gate, and the second signal CK2 has a voltage of 0V.

At an instant t2, the first signal CK1 becomes invalid and has a voltage of 0V. As a result, the second pMOS transistor P2 raises the voltage at the first node a to 2×VDD. The voltage 2×VDD is transferred by the third pMOS transistor P3 to the second node b, so the voltage at the second node b is 2×VDD. Therefore, the second signal CK2 is valid and has a voltage equal to 2×VDD, and the boosted voltage output at the gate of the first nMOS transistor N1 is 2×VDD. The gate of the first nMOS transistor N1 acts as a boost capacitor. The n stages of the boost capacitor circuits thereby accumulate the charge stored on the n gates of the first nMOS transistors N1 and output the accumulated charge to the output terminal VOUT.

At such, the gates of the first nMOS transistor N1s boost the voltage by about 2×VDD, resulting in area efficiency:

$$\frac{C1 \times 2 \times VDD}{C1 + C2} \times C,$$

where, C1 represents the capacitance per unit area of the first nMOS transistor N1, C2 is the capacitance per unit area of the second pMOS transistor P2, and C denotes the value of capacitance per unit area. Generally, as C1 is greater than C2, an improvement in area efficiency can be obtained. For example, when the boost capacitor circuit 11 is fabricated with a 90-nm process, the area efficiency will be about 1.25×C×VDD. That is, with an increased amount of charge transferred by each unit area, the area efficiency is improved.

The above process is repeated with the first signal CK1 becoming valid at another instant t1.

Obviously, those skilled in the art may make various modifications and alterations without departing from the spirit and scope of the invention. It is therefore intended that the invention be construed as including all such modifications and alterations insofar as they fall within the scope of the appended claims or equivalents thereof.

What is claimed is:

1. A boost capacitor circuit, comprising a first nMOS transistor and a voltage doubler circuit, the first nMOS transistor having a gate for providing a boosted voltage, the voltage doubler circuit comprising:
a first pMOS transistor, having a drain coupled to a working voltage, a source coupled to a first node and a gate coupled to a second node;
a drive inverter, having an input terminal for receiving a first signal;
a second pMOS transistor, having a gate coupled to an output terminal of the drive inverter, a source and a drain coupled to each other and further to the first node;
a third pMOS transistor having a gate for receiving the first signal, a source coupled to the first node and a drain coupled to the second node; and
a second nMOS transistor, having a gate for receiving the first signal, a source coupled to a low voltage and a drain coupled to the second node,
wherein a source and a drain of the first nMOS transistor are coupled to each other and further to the second node for receiving a second signal from the second node.

2. The boost capacitor circuit according to claim 1, wherein the first signal is valid when a voltage thereof is equal to the working voltage.

3. The boost capacitor circuit according to claim 1, wherein the second signal is invalid when the first signal is valid, and the second signal is valid and has a voltage that is twice the working voltage when the first signal is invalid.

4. The boost capacitor circuit according to claim 1, wherein the first nMOS transistor is a thick-gate-oxide nMOS transistor.

5. The boost capacitor circuit according to claim 4, wherein the first nMOS transistor has a gate oxide layer with a thickness of 60-200 Å.

6. The boost capacitor circuit according to claim 1, wherein the first pMOS transistor and the second pMOS transistor are both thin-gate-oxide pMOS transistors.

7. The boost capacitor circuit according to claim 6, wherein both of the first pMOS transistor and the second pMOS transistor have a gate oxide layer with a thickness of smaller than 40 Å.

8. The boost capacitor circuit according to claim 1, wherein the third pMOS transistor is a thick-gate-oxide pMOS transistor.

9. The boost capacitor circuit according to claim 8, wherein the third pMOS transistor has a gate oxide layer with a thickness of 60-200 Å.

10. The boost capacitor circuit according to claim 1, wherein the second nMOS transistor is a thick-gate-oxide nMOS transistor.

11. The boost capacitor circuit according to claim 10, wherein the second nMOS transistor has a gate oxide layer with a thickness of 60-200 Å.

12. A charge pump, comprising n stages of boost capacitor circuits as defined in claim 1, wherein the gates of the first nMOS transistors of the n stages of boost capacitor circuits are connected one after another, and wherein n is a positive integer greater than or equal to 2.

13. The charge pump according to claim 12, wherein the gates of the first nMOS transistors of the n stages of boost capacitor circuits that are connected one after another are coupled to an output terminal of the charge pump for providing an output voltage to a memory cell.

14. The charge pump according to claim 13, wherein a switching element is disposed between each adjacent two of the n stages of boost capacitor circuits and between a last one of the n stages of boost capacitor circuits and the output terminal.

* * * * *